(12) United States Patent
Shioda

(10) Patent No.: US 8,175,424 B2
(45) Date of Patent: May 8, 2012

(54) ELECTRICAL AND OPTICAL HYBRID BOARD AND MANUFACTURING METHOD OF THE SAME

(75) Inventor: Tsuyoshi Shioda, Chiba (JP)

(73) Assignee: Mitsui Chemicals, Inc., Minato-Ku, Tokyo (JP)

(*) Notice: Subject to any disclaimer, the term of this patent is extended or adjusted under 35 U.S.C. 154(b) by 365 days.

(21) Appl. No.: 12/516,214

(22) PCT Filed: Dec. 21, 2007

(86) PCT No.: PCT/JP2007/074651
§ 371 (c)(1),
(2), (4) Date: May 26, 2009

(87) PCT Pub. No.: WO2008/078680
PCT Pub. Date: Jul. 3, 2008

(65) Prior Publication Data
US 2010/0065309 A1     Mar. 18, 2010

(30) Foreign Application Priority Data

Dec. 26, 2006  (JP) ................................. 2006-350440

(51) Int. Cl.
G02B 6/12     (2006.01)
(52) U.S. Cl. .......................................... 385/14; 385/129
(58) Field of Classification Search ................... None
See application file for complete search history.

(56) References Cited

U.S. PATENT DOCUMENTS

| | | | |
|---|---|---|---|
| 7,203,388 B2 | 4/2007 | Ha et al. | |
| 2003/0128907 A1* | 7/2003 | Kikuchi et al. | 385/14 |
| 2005/0094922 A1* | 5/2005 | Ha et al. | 385/14 |
| 2005/0117846 A1* | 6/2005 | Amleshi et al. | 385/49 |
| 2008/0044127 A1* | 2/2008 | Leising et al. | 385/14 |
| 2009/0142026 A1* | 6/2009 | Shioda | 385/131 |
| 2009/0304324 A1* | 12/2009 | Kim et al. | 385/14 |

FOREIGN PATENT DOCUMENTS

| | | |
|---|---|---|
| JP | 63-253305 A | 10/1988 |
| JP | 6-118256 A | 4/1994 |

(Continued)

OTHER PUBLICATIONS

International Search Report (Form PCT/ISA/210) dated Jan. 10, 2008.

*Primary Examiner* — Mike Stahl
(74) *Attorney, Agent, or Firm* — Buchanan Ingersoll & Rooney PC

(57) ABSTRACT

To provide an electrical and optical hybrid board that has on one surface an optical waveguide and on the other surface an electrical interconnect pattern or the like, in which the core pattern and electrical interconnect pattern or the like are positioned in place with high accuracy, and a method of manufacturing the same. The method includes: preparing laminate 4 of core layer 21 and clad layer 20 on an electrical wiring board; forming alignment mark 12 and electrical interconnect pattern 13 or electrical joint at the same time on a surface of the electrical wiring board opposite to a surface where laminate 4 is formed, alignment mark 12 used for forming a core pattern of optical waveguide, the electrical joint used for connection with an external device; and forming a core pattern of optical waveguide on the basis of alignment mark 12 without using a photomask.

12 Claims, 3 Drawing Sheets

FOREIGN PATENT DOCUMENTS

| | | | |
|---|---|---|---|
| JP | 8-286064 A | | 11/1996 |
| JP | 2002-107560 A | * | 4/2002 |
| JP | 2004-535070 A | | 11/2004 |
| JP | 2004-341454 A | | 12/2004 |
| JP | 2005-134862 A | | 5/2005 |
| JP | 2005-258311 A | * | 9/2005 |
| JP | 2006-189483 A | | 7/2006 |
| JP | 2007-093747 A | | 4/2007 |

* cited by examiner

ELECTRICAL AND OPTICAL HYBRID BOARD AND MANUFACTURING METHOD OF THE SAME

TECHNICAL FIELD

The present invention relates to an electrical and optical hybrid board which includes an electrical wiring board and an optical waveguide including a core layer and a clad layer laminated on the electrical wiring board, and to a method of manufacturing the same.

BACKGROUND ART

An electrical and optical hybrid board is a device that includes an electrical wiring board and an optical waveguide including a core layer and a clad layer laminated on the electrical wiring board. As a device converting electric signal into optical signal, electrical and optical hybrid boards hold promise of being used in fields requiring high-speed information processing. In such an electrical and optical hybrid board it is important that the electrical interconnect pattern (electrical circuit) of the electrical wiring board be precisely aligned with the core pattern (optical waveguide pattern); therefore, there have been proposed methods of increasing the alignment accuracy.

Patent Document 1 discloses a method of manufacturing an electrical and optical hybrid board by use of a transparent photosensitive resin layer and a metal layer, the method including the steps of (a) forming a core pattern of optical waveguide by irradiating the transparent photosensitive resin layer with an active energy beam; (b) forming a deflection part for deflecting light propagating through the optical waveguide; and (c) forming an electrical circuit by patterning the metal layer, wherein the core, deflection part, and electrical circuit are formed on the basis of fiducial marks previously provided in the metal layer.

Patent Document 2 discloses a method of manufacturing an optical waveguide board that includes a board on which an element or the like having a light-emitting part is formed, and an optical waveguide formed on the surface on which the element is formed, the method including the steps of (a) forming the element on the board; and (b) forming the optical waveguide having a core and a clad on the surface of the board where the element is formed, wherein in the step (b) the core is formed as a pattern that overlaps the light-emitting part as viewed from directly above the electrical and optical hybrid board, and the light-emitting part and/or terminal is used as a reference mark for core formation.

Patent Document 3 discloses a method of integrating an optical layer in a printed circuit board that includes an insulating material to which a first layer of copper foil is bonded, the method including the steps of (a) preparing the printed circuit board; (b) laminating on the copper layer a layer of first polymer material having a refraction index of n2; (c) laminating on the layer of first polymer material a layer of second polymer material having a refraction index of n1, where n1 is greater than n2; (d) creating a channel through the layers of first and second polymer material; (e) laminating a top layer of the first polymer material so as to fill the channel and cover the remaining layer of second polymer material; (f) laminating onto the top layer a layer of prepreg material; and (g) laminating onto the prepreg material a second layer of copper foil.

In the method disclosed by Patent Document 1, fiducial marks for alignment are previously provided in the metal layer, and a core pattern of optical waveguide and an electrical interconnect pattern (electrical circuit) are formed on the basis of the fiducial marks. It is therefore necessary for this method to align both of the electrical pattern and core pattern with the fiducial marks, which is demanding and in this case alignment accuracy is not so high.

The method disclosed by Patent Document 2 manufactures an optical waveguide board in which elements and the like are embedded between the electrical interconnect pattern board and optical waveguide. This method uses some of the elements as alignment marks upon formation of a core pattern of optical waveguide. Namely, since the alignment marks contact a layer composed of a core layer and clad layers (hereinafter referred to as "core/clad layer") of the optical waveguide board, the alignment accuracy between the embedded device pattern and core pattern increases.

The method disclosed by Patent Document 3 provides alignment marks for the core pattern formation onto a surface of an electrical wiring board on which a core/clad layer is provided. This undesirably reduces the alignment accuracy between the core pattern and the electrical interconnect pattern which is present on the opposite side of the board to the core/clad layer.

Patent Document 1: Japanese Patent Application Laid-Open No. 2004-341454
Patent Document 2: Japanese Patent Application Laid-Open No. 2006-189483
Patent Document 3: Japanese Patent Application Laid-Open No. 2004-535070

DISCLOSURE OF INVENTION

Problems to be Solved by the Invention

As described above, conventional manufacturing methods for an electrical and optical hybrid board cannot obtain a sufficient alignment accuracy between the core pattern of optical waveguide and electrical interconnect pattern or electrical joint (hereinafter referred to as "electrical interconnect pattern or the like") which is provided on the opposite surface of the board to the optical waveguide. It is therefore an object of the present invention to provide: an electrical and optical hybrid board that has on one surface an optical waveguide and on the other surface an electrical interconnect pattern or the like, in which the core pattern and electrical interconnect pattern or the like are positioned in place with high accuracy; and a method of manufacturing the electrical and optical hybrid board.

Means for Solving the Problem

As a result of extensive studies, the inventors established that the above problems can be solved by providing, on an electrical and optical hybrid board surface to be provided with an electrical interconnect pattern or the like, alignment marks used for the core pattern formation in the same process as the electrical interconnect pattern or the like. That is, the above problems can be solved by the manufacturing method of the present invention described below.

[1] A method of manufacturing an electrical and optical hybrid board which includes an electrical wiring board and an optical waveguide including a core layer and a clad layer laminated on the electrical wiring board, the method including: (A) preparing a laminate of the core layer and clad layer on the electrical wiring board; (B) forming an alignment mark and an electrical interconnect pattern or electrical joint at the same time on a surface of the electrical wiring board that is opposite to a surface where the laminate is formed, the alignment mark used for forming a core pattern of optical waveguide, the electrical joint used for connection with an external device; and (C) forming a core pattern of optical waveguide on the basis of the alignment mark without using a photomask.

[2] The method according to [1] above, wherein the electrical joint is an external lead-out electrode provided on an edge of the electrical wiring board, and step (B) is a step of patterning the external lead-out electrode and the alignment mark at the same time.

[3] The method according to [1] or [2] above, wherein the electrical joint is a terminal formed of an opening in a surface protection layer provided on the electrical interconnect pattern of the electrical wiring board for protecting the electrical interconnect pattern, and step (B) is a step of forming the terminal and the alignment mark at the same time when the surface protection layer is provided.

[4] The method according to any one of [1] to [3] above, wherein step (C) is a step of forming the core pattern by providing grooves defining a core on the basis of the alignment mark.

[5] The method according to any one of [1] to [4] above, wherein the alignment mark is provided at two or more corners of the surface of the electrical wiring board that is opposite to the surface where the laminate is formed, and step (C) is a step of forming the core pattern on the basis of a pattern determined by measuring the distance between the alignment marks.

[6] The method according to any one of [1] to [5] above, wherein at least one alignment mark is provided on the surface of the electrical wiring board that is opposite to the surface where the laminate is formed, at a position corresponding to or near the core pattern to be formed, and step (C) is a step of forming the core pattern on the basis of a pattern whose start point or end point has been determined based on the alignment mark.

The above problems can also be solved by the electrical and optical hybrid board of the present invention below.

[7] An electrical and optical hybrid board including: an electrical wiring board; and an optical waveguide on the electrical wiring board, wherein the electrical wiring board includes, on a surface opposite to a surface where the optical waveguide is formed, an electrical interconnect pattern or electrical joint for electrical connection with an external device, and a mark made of the same material as the electrical interconnect pattern or electrical joint.

[8] The electrical and optical hybrid board according to [7], wherein the electrical wiring board includes: a mark formed of a surface protection layer provided for protecting the electrical interconnect pattern; and the electrical joint which is provided over the electrical interconnect pattern and is formed of an opening in the surface protection layer.

Advantageous Effect of the Invention

The present invention can provide an electrical and optical hybrid board in which a core pattern of optical waveguide and an electrical interconnect pattern or the like are positioned in place with high accuracy.

BEST MODE FOR CARRYING OUT THE INVENTION

Figure 1:
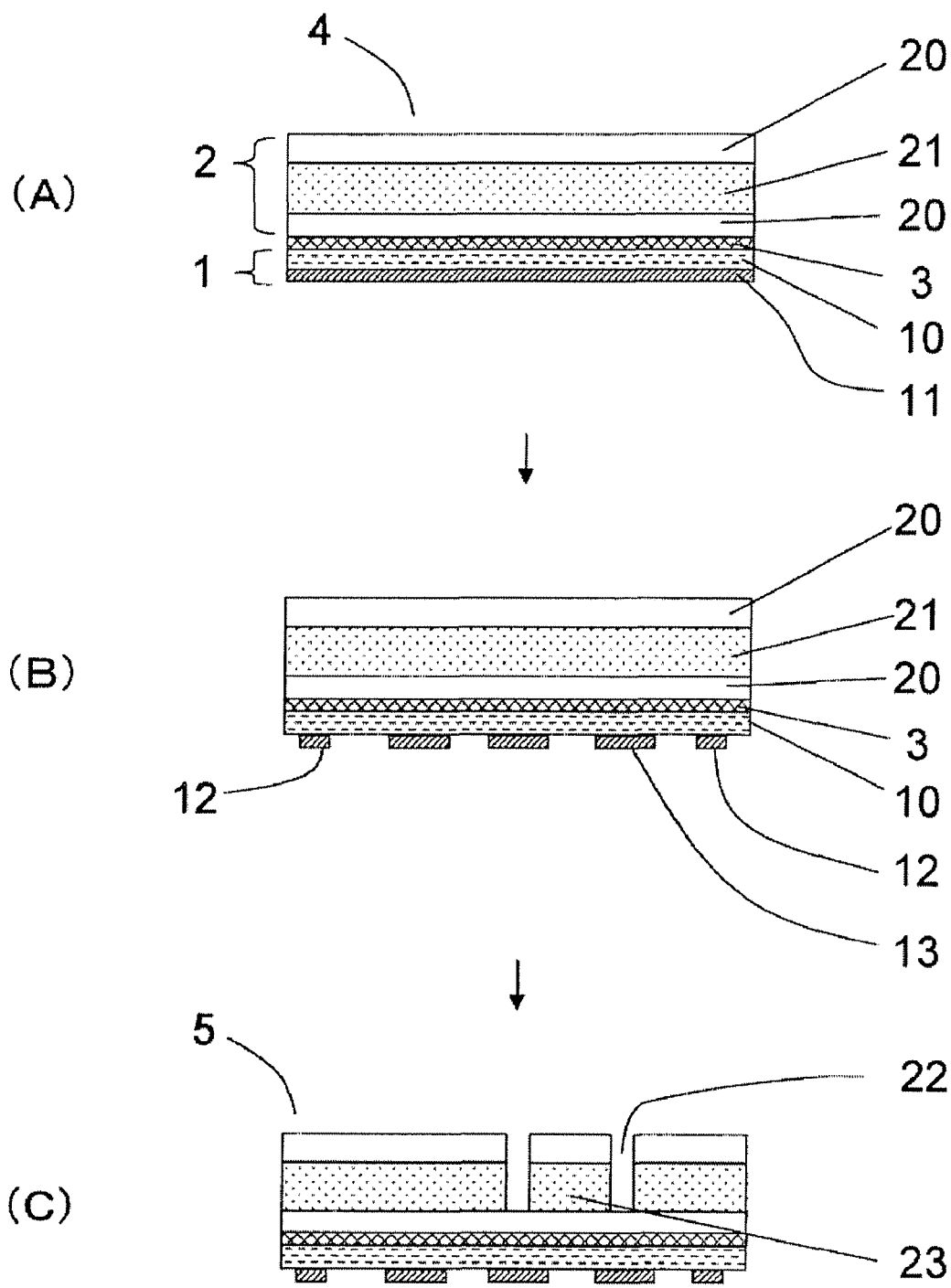
FIG. 1 shows a manufacturing method of the present invention.

1. Manufacturing Method of Electrical and Optical Hybrid Board

A manufacturing method of the present invention includes the steps of:

(A) preparing a laminate of a core/clad layer (hereinafter referred to as "core/clad laminate") on an electrical wiring board;

(B) forming an alignment mark (used for the formation of a core pattern of optical waveguide) and an electrical interconnect pattern or the like (electrical interconnect pattern or electrical joint) at the same time on a surface of the electrical wiring board that is opposite to the surface where the core/clad laminate is formed; and (C) forming a core pattern of optical waveguide on the basis of the alignment mark without using a photomask.

"Core/clad layer" or "core/clad laminate" in step A means an optical waveguide before a core pattern is formed therein, i.e., an optical waveguide precursor or a laminate thereof. "Core pattern" refers to a core that has been formed in a desired shape such that light propagates therein. Hereinafter, "surface of the electrical wiring board that is opposite to the surface where the core/clad laminate is formed" in step B simply refers to as "electrical interconnect pattern surface."

1-1 Electrical Wiring Board

"Electrical wiring board" refers to a member that includes a conductive layer provided on an insulating substrate primarily made of resin. An electrical interconnect pattern is generally formed as the conductive layer; however, a conducive layer having no features may be formed over the entire surface of the insulating substrate. "Electrical interconnect pattern" refers to an electrical wiring circuit. "Pattering" means formation of an electrical wiring circuit. The conductive layer can be made of metal such as copper, and the electrical interconnect pattern can be formed by etching the metal. Alternatively, the conductive layer and electrical interconnect pattern may be formed using a conductor-filled resin such as a conductive paste. It is only necessary for the electrical wiring board to have a conductive layer on one surface. In the case of a double-sided or multi-layered electrical wiring board, the conductive layer may be provided inside the electrical wiring board.

Any known electrical wiring board can be employed in the present invention. However, it is preferable to use an electrical wiring board whose insulating substrate is either made of heat-resistant resin such as epoxy resin or polyimide resin, or a composite material composed of the above heat-resistant resin and a base material such as a glass cloth. In particular, an electrical wiring board that includes as an insulating substrate a base material-free heat-resistant resin film is preferable because it undergoes large size changes due to, for example, thermal history effect. Examples of preferable heat-resistant resin films include polyimide films whose thickness is 5-100 μm, more preferably 10-50 μm.

The electrical wiring board preferably includes an electrical joint through which the board is electrically connected to an external device. Examples of the electrical joint include external lead-out electrodes for connection with connectors etc., and terminals for connection with light receiving/emitting elements etc. "Electrode" refers to an electrical conductor or the like which has a predetermined shape provided at the edge of the electrical circuit for feeding a current to conducive wires and the like. "Terminal" refers to a current gateway provided for connection of the electrical circuit. Terminals are often provided on the electrical interconnect pattern.

The electrical interconnect pattern may include a surface protection layer for pattern protection. Examples of the surface protection layer include layers prepared by application of solder resists and layers formed of cover lay films. The solder resist is a heat-resistant coating composed of epoxy resin and other materials and is used to prevent solder from attaching to unnecessary portions of the electrical interconnect pattern upon soldering. A protection layer can be provided by applying a solder resist on the electrical interconnect pattern in a desired shape. The method of applying the solder resist is not specifically limited; examples thereof include screen printing.

"Cover lay film" is a surface protection film used for the same purpose as the solder resist, and is composed of polyimide resin and other materials. The cover lay film is cut into a piece of desired shape and attached to the electrical interconnect pattern surface.

1-2 Optical Waveguide

"Optical waveguide" refers to a device which includes a core and a clad and in which light propagates through the core. "Core" refers to a portion of an optical waveguide, which has a high refraction index and through which light propagates mainly. "Clad" refers to a portion having a lower refraction index than the core.

The core and clad of the optical waveguide in the present invention are made of any of inorganic material and polymer material. However, when a core/clad laminate is to be laminated on an electrical wiring board as in the present invention, it is preferable that the core and clad be both made of polymer material in view of high workability.

Examples of the polymer material include polyimide resins, epoxy resins and polybenzoxazole resins. The core and clad may be formed using any of these polymer materials according to the intended purpose. The core and clad are preferably made of the same type of resin in view of mutual adhesion. Preferable examples of such a core/clad combination include a combination in which the clad is made of polyimide resin formed of 2,2-bis(3,4-dicarboxyphenyl) hexafluoropropane dianhydride (6FDA) and 2,2-bis(trifluoromethyl)-4,4'-diaminobiphenyl (TFDB), and the core is made of polyimide resin which is formed of 6FDA/TFDB polyimide and 6FDA/4,4'-oxydianiline (ODA) polyimide.

The optical waveguide in the present invention may be obtained by preparing an optical waveguide precursor made of resin which undergoes refraction index changes by exposure to an active beam and applying the active beam to form a core. Examples of such a resin include norbornene resins and polysilane resins.

1-3 Step A

The manufacturing method of the present invention includes the step of preparing a laminate in which a core layer and a clad layer are laminated onto an electrical wiring board. The preparation is achieved by (1) providing a core/clad laminate onto an electrical wiring board; (2) preparing a core/clad laminate in advance and then bonding it to an electrical wiring board; and so forth.

The method (1) above first prepares a varnish in which the above polymer material is dissolved in a solvent, and applies the varnish on an electrical wiring board. Examples of the coating method include spin coating, spray coating, applicator method, and dipping. Specifically, a polymer material varnish for clad layer is applied on the electrical wiring board and dried, and a polymer material varnish for core layer is applied on the obtained clad layer and dried. Where necessary, the polymer material varnish for clad layer is again applied on the obtained core layer and dried. In the case where a core/clad laminate is to be prepared that is made of resin that undergoes refraction index changes by exposure to an active beam, vanishes of this resin may be applied on the electrical wiring board in a similar way.

The method (2) above first prepares a core/clad laminate by applying the polymer material vanishes onto a releasing film, silicon wafer, glass plate or the like, drying the vanishes, and releasing the obtained laminate from the releasing film or the like, and then bonds the resultant core/clad laminate to an electrical wiring board prepared in advance. Any known adhesive can be used for bonding. Examples of the adhesive include epoxy resin adhesives.

In the present invention any of the methods (1) and (2) may be employed. However, when a flexible electrical and optical hybrid board is to be manufactured in which a polymer optical waveguide is laminated onto a flexible electrical wiring board, it is preferable to employ the method (2) because this method can hollow out the center portion of the electrical wiring board more easily than the method (1). The reason for hollowing out the center portion is to prevent peeling of a flexible electrical and optical hybrid board which is often used in a bent state, where stress converges to the board center to cause peeling.

Alternatively, of course, the core-clad laminate may be purchased ready-made, for example.

FIG. 1 shows the steps of a manufacturing method of the present invention. FIG. 1A shows a cross-sectional view of a laminate prepared in step A, where the above core/clad layer is laminated onto an electrical wiring board. In FIG. 1A, reference numeral 4 denotes a laminate in which the core/clad layer is laminated onto an electrical wiring board. The laminate includes electrical wiring board 1, core/clad laminate 2 and adhesion layer 3. Electrical wiring board 1 includes insulating substrate 10 and conductive layer 11, and clad/core laminate 2 includes clad 20 and core 21. In this drawing a laminate prepared using the above method (2) is shown, where core/clad laminate 2 is bonded to electrical wiring board 1 via adhesion layer 3; however, a laminate prepared using the above method (1) may be employed, where adhesion layer 3 is not provided.

1-4 Step B

A manufacturing method of the present invention includes the step of forming an alignment mark and an electrical interconnect pattern or electrical joint (electrical interconnect pattern or the like) at the same on a surface of the electrical wiring board that is opposite to the surface where the core/clad layer is laminated (electrical interconnect pattern surface). The alignment mark is used as a basis of forming a core pattern of optical waveguide. FIG. 1B shows step B. In FIG. 1B reference numeral 12 denotes an alignment mark, and reference numeral 13 denotes an electrical interconnect pattern. Note that no description is and will be made to the same references as those of the drawing which have been explained before.

"Surface of the electrical wiring board that is opposite to the surface where the core/clad layer is laminated (electrical interconnect pattern surface)" is either a surface of the electrical wiring board that is opposite to the surface where a core layer and clad layers have been formed (see FIG. 1B), or a surface opposite to the surface where the core layer and clad layers are to be formed. Accordingly, the step of "forming an alignment mark and an electrical interconnect pattern or the like at the same" is of two types: forming the alignment mark, etc., on a surface of the electrical wiring board that is opposite to the surface where the core layer and clad layers are laminated; and forming the alignment mark etc., on the electrical wiring board before formation of the core layer and clad layers thereon. Namely, in the former case, step B is preceded by step A, and in the latter case, step A is followed by step B. For simplification purpose, the former case will be described below.

Figure 2:
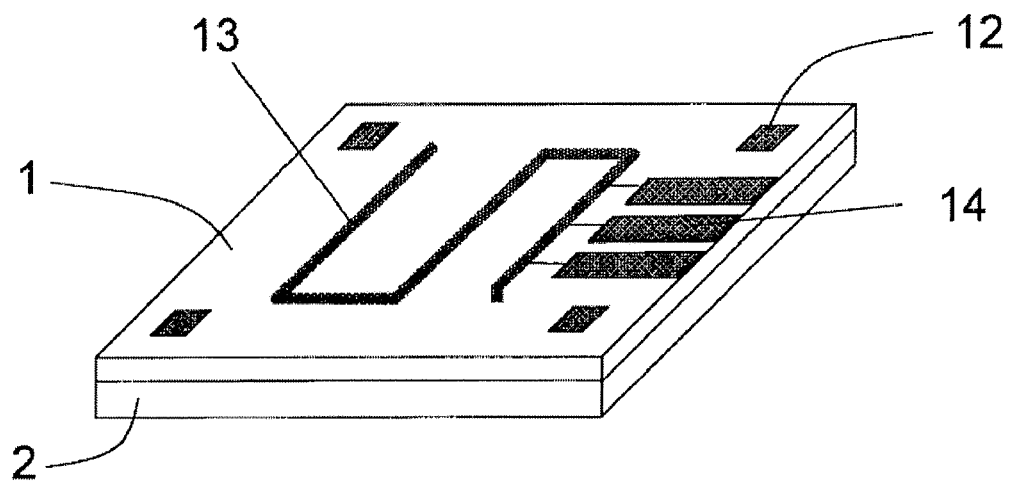
FIG. 2 is a perspective view of a laminate prepared through step A and step B.

"Alignment mark" is a mark used when forming a core pattern of optical waveguide. The mark shape is, for example, square, cross or circle. Alignment marks having such a shape are marks that are positively provided and can be easily recognized. Among other alignment marks, square marks of about 100 μm each side are preferable. The positions where these alignment marks are provided are not specifically limited as long as they are provided on the electrical interconnect pattern surface. For increased alignment accuracy, it is preferable to (1) provide alignment marks at two or more corners of the electrical interconnect pattern surface, or (2) provide at least one alignment mark on the electrical interconnect pattern surface at a position corresponding to or near the core pattern to be formed in the core/clad laminate. FIG. 2 is a perspective view of the laminated prepared through steps A and B, which is placed with the electrical interconnect pattern surface facing up. In FIG. 2 reference numeral 12 denotes an alignment mark, 13 denotes an electrical interconnect pattern, and 14 denotes an external lead-out electrode (adhesion layer 3 is not shown).

The description "provide alignment marks at two or more corners of the electrical interconnect pattern surface" above means that alignment marks are provided at 2-4 corners of on the electrical interconnect pattern surface. "Corner" means a portion close to the corner of the electrical wiring board that is generally a square. The positions where the alignment marks are to be provided are not specifically limited as long as they are provided at positions close to the corners of the electrical wiring board.

The description "a position corresponding to or near the core pattern to be formed in the core/clad laminate" above means a portion corresponding to a core pattern projected on the electrical interconnect pattern surface. Namely, this position exactly overlaps the core pattern to be formed in the core/clad layer, as viewed from directly above the electrical and optical hybrid board placed with the core/clad laminate facing up. Accordingly, with the method (2) above, alignment marks are provided at positions of the electrical interconnect pattern surface which overlap or are close to the position where a core pattern is to be formed.

These alignment marks are formed on the electrical interconnect pattern surface of an electrical wiring board (a surface where no core/clad laminated is provided) For this reason, the clad/core laminate and electrical wiring board are preferably transparent in order to facilitate alignment mark recognition. The clad/core laminate and electrical wiring board may be made of material that is visually opaque but transmits light in a specific wavelength range.

Alternatively, specific features of the electrical interconnect pattern or the like may be used as alignment marks instead of positively-formed marks described above.

The alignment mark is formed at the same time as an electrical interconnect pattern or electrical joint (electrical interconnect pattern or the like) in order to provide them in place with high accuracy. The underlying mechanism of this will be described below.

First, the importance of alignment accuracy between the core pattern and electrical interconnect pattern or the like in an electrical and optical hybrid board will be described.

An electrical and optical hybrid board is often used with light receiving/emitting elements, etc., mounted to its electrical joints (terminals) which are formed over the electrical interconnect pattern. The light receiving/emitting element is a device for mutual conversion between electrical and optical signals. In order for an electrical and optical hybrid board to efficiently receive light from the light emitting element mounted thereon, the optical center of the light emitting element needs to be aligned with the core center of the electrical and optical hybrid board with high accuracy. The position of the light emitting element to be mounted depends on the position of the corresponding terminal in the electrical and optical hybrid board. Accordingly, it is important that the positions of the core of the optical waveguide, electrical interconnect pattern in the electrical wiring board provided on the opposite side of the electrical and optical hybrid board to the optical waveguide, and terminal formed over the electrical wiring board be of high accuracy.

Moreover, the electrical and optical hybrid board is often used with its terminal connected to an external connector or the like, which is already provided with an optical fiber, light receiving/emitting element and terminal. The optical fiber and light receiving/emitting element transmits or receives light to or from the optical waveguide, and the terminal of the external connector connects with the external lead-out electrode of the electrical wiring board. Thus, if the core of the electrical and optical hybrid board and the external lead-out electrode become misaligned, it may result in connection failure to external connectors. More specifically, it is also important in this case that the core of the optical waveguide and electrical interconnect pattern or like on the electrical wiring board be provided in place with high accuracy.

Note, however, that there is no need to faithfully ensure their absolute positions as initially designed. "Absolute position" means a position defined by a specific measure value, e.g., a position spaced from a certain point of an electrical interconnect pattern by the distance of - - - mm.

For example, suppose that two electrical interconnect pattern lines are patterned at an interval of 1.00 mm, and that a core pattern is so designed that the core center comes to the midpoint between the electrical interconnect pattern lines, i.e., at a position 0.50 mm away from the first electrical interconnect pattern line. In this case, if the electrical and optical hybrid board has experienced size changes due to certain external factors and thereby the actual distance between the patterned lines is shortened to 0.95 mm, the core center never comes to the desired position (the midpoint between the electrical interconnect pattern lines), even when attempting to faithfully place the core center exactly at the position 0.5 mm away from the first electrical interconnect line according to the initial design. Consequently, when a light emitting element is mounted on the electrical and optical hybrid board in such a state, the optical center and core center become misaligned and therefore the light emitting element cannot exert desired performance.

However, if the relative positions of the core center and electrical interconnect pattern lines as designed (i.e., the core center is placed at the midpoint between two adjacent electrical interconnect pattern lines) can be reproduced in the final product, the performance of the electrical and optical hybrid board will not be impaired even when their absolute positions have changed. Namely, the positional relationship between the core pattern and electrical interconnect pattern or the like can be considered "relatively" rather than "absolutely." More specifically, "alignment marks and electrical interconnect pattern or the like can be provided in place with high accuracy" means that the relative positions of these features as initially designed are reproduced in the actual product. Hereinafter, this will be expressed as "excellent in terms of relative position accuracy."

Next, description will be made to the relationship between "alignment marks are provided in the same process as the electrical interconnect pattern or the like" and "core pattern and electrical interconnect pattern or the like can be obtained that are excellent in terms of relative position accuracy."

By providing alignment marks in the same process as the electrical interconnect pattern or the like, process-to-process size variations can be eliminated, increasing the relative position accuracy. For example, in a case where an electrical interconnect pattern or the like is formed by etching of a metal layer (e.g., copper layer), and alignment marks are then formed by another etching of the metal layer while masking the electrical interconnect pattern, the relative position accuracy between the electrical interconnect pattern and alignment marks may decrease due to subtle changes in the etching condition between the two etching processes. However, since the alignment marks and electrical interconnect pattern or the like are formed under the same condition when they are produced in the same process, there is no reduction in the relative position accuracy. Moreover, they are preferably made of the same material because size change amount differences due to etching condition variations can be also eliminated, whereby the relative position accuracy can be enhanced.

A core pattern is then provided on the basis of the high-reliability alignment marks, which increases the relative position accuracy between the core pattern and electrical interconnect pattern or the like. Even if, prior to core pattern formation, the electrical and optical hybrid board experienced size changes (i.e., the absolute positions of the electrical interconnect pattern and alignment marks have changed) due to external factors, a high relative position accuracy is retained between the alignment marks and electrical interconnect pattern or the like. Thus, by forming the core pattern on the basis of the alignment marks, the relative position accuracy among the electrical interconnect pattern or the like, alignment marks, and core pattern can be retained high.

Thus, by forming the alignment marks and electrical interconnect pattern or the like at the same time, the relative position accuracy among the electrical interconnect pattern or the like, alignment marks, and core can be retained high at all times.

A method of forming an electrical interconnect pattern or the like and alignment marks at the same time by etching has been described by way of example. The same holds true for the case where the electrical interconnect pattern or the like and alignment marks are formed using a surface protection layer.

When an electrical joint (terminal) through which a light receiving/emitting element etc., is mounted to an electrical interconnect pattern is to be provided in an electrical and optical hybrid board, the terminal may be provided in the form of an opening formed in a surface protection layer which is provided for electrical interconnect pattern protection. More specifically, by forming a surface protection layer over the electrical interconnect pattern surface at areas other than those corresponding to terminals to be provided, as opposed to forming the surface protection layer over the entire surface of the electrical interconnect pattern surface, openings are formed that serve as terminals. For example, when the protection layer is provided using a solder resist, areas not coated with the solder resist (non-coated areas) become terminals. The same holds true for a cover layer film as a protection layer. In view of workability, it is preferable to use a solder resist. When the alignment marks are provided in the same process as the terminals, the foregoing effect can be obtained. The alignment marks may be provided for example as square or cross marks on the electrical interconnect pattern surface (preferably at the corners), or as openings in the protective layer. Alternatively, the alignment marks may be provided for example as square marks like islands in the openings. In this case, when the opening is seen as "sea" the alignment mark become like an "island" floating in the sea.

Figure 3:
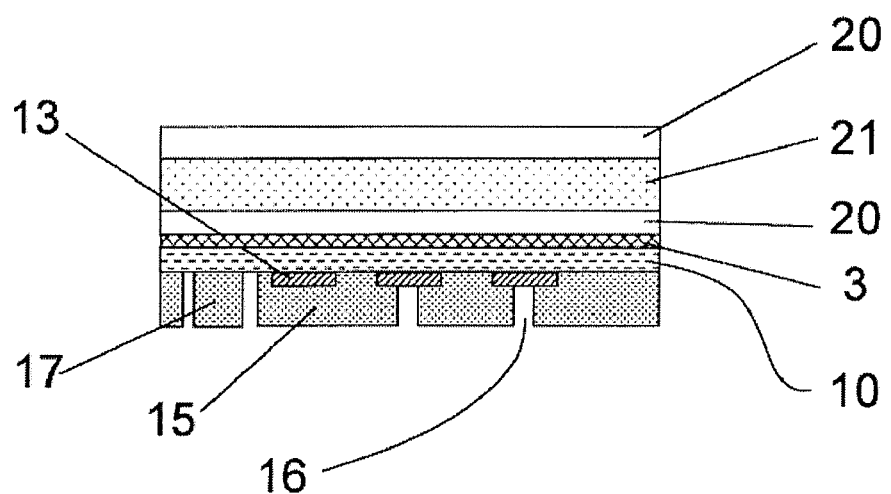
FIG. 3 is a cross-sectional view of a laminate in which terminals are provided using a solder resist.
Figure 4:
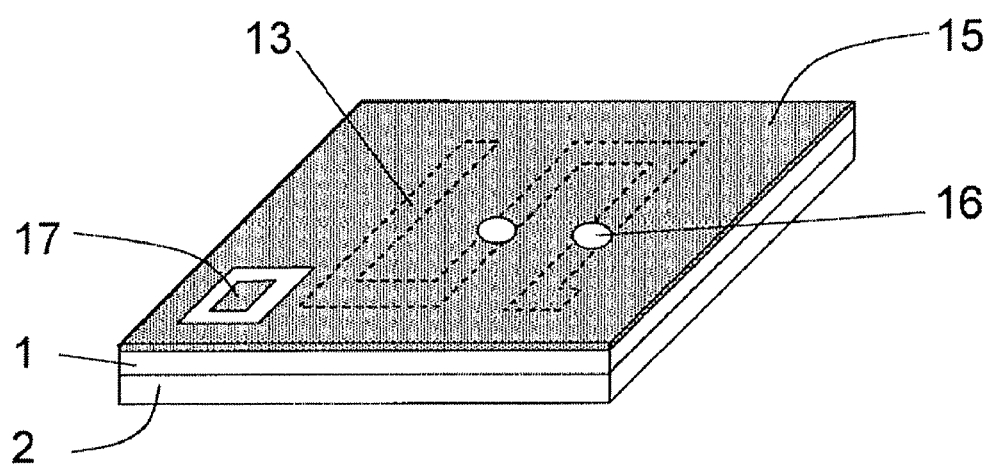
FIG. 4 is a perspective view of the laminate shown in FIG. 3.

FIG. 3 shows the above configuration. In FIG. 3 reference numeral 15 denotes a solder resist, 16 denotes a terminal formed of a non-coated area in the solder resist, and 17 denotes an alignment mark defined by the solder resist. FIG. 4 is a perspective view of the laminate shown in FIG. 3, where terminals 16 are provided over the electrical interconnect pattern (adhesion layer 3 is not shown). Namely, by providing terminals by application of a solder resist at areas of the electrical interconnect pattern other than those where the terminals are to be formed and providing alignment mark 17, the relative position accuracy between the electrical joint and alignment mark can be increased as described above. In this case, the non-coated area (non-coated area where alignment mark 17 is not provided) itself may be used as an alignment mark without positively providing any alignment mark.

Conductors such as solder balls may be placed in the electrical joints formed. When solder balls are used to mount light receiving/emitting elements on the electrical and optical hybrid board, alignment is made possible with higher accuracy by virtue of their self-alignment effect.

1-5 Step C

A manufacturing method of the present invention includes the step of forming a core pattern of optical waveguide on the basis of the alignment mark on the electrical wiring board without using a photomask. A photomask is a plate in which a core pattern has been imaged on a substrate. In a general process a core/clad layer made of photosensitive material is covered with the photomask and irradiated with an active beam to expose selected portions of the core/clad layer through the openings of the mask to form a core pattern.

In the present invention a core pattern of optical waveguide is formed without using any photomask. This is because the dimensional stability of a photomask itself is not high enough to readily increase the relative position accuracy between the core and electrical interconnect pattern or the like.

Examples of the method of forming a core pattern of optical waveguide without using any photomask include a method where grooves are formed in a core/clad laminate which includes in sequence, a clad layer, a core layer and a clad layer by means of mechanical cutting using a dicing saw or by means of laser ablation, to define cores therein. Alternatively, a core pattern may be provided by direct imaging of a clad/core layer with a laser beam, the clad/core layer including a core layer whose refraction index changes by exposure to an active beam. The formation method is not specifically limited to those described above; however, the method using a dicing saw is preferably used in view of workability and safety.

In step (C) a core pattern is formed on the basis of alignment marks. That "core pattern is formed on the basis of alignment marks" means that the alignment marks are recognized and a core pattern to be formed is determined based on the alignment marks. The alignment marks may be recognized visually, or an image may be taken using a camera or microscope for visual recognition or for subsequent image processing. As described above, since the alignment marks are present on the opposite side of the electrical and optical hybrid board to the clad/core laminate, the clad/core laminate and the insulating substrate of the electrical wiring board are preferably transparent in order to facilitate recognition. However, when these members are made of material that is visually opaque but transmits light in a specific wavelength range, recognition is made possible by application of a specific light beam to obtain image information of the alignment marks.

The core pattern of optical waveguide is formed based on the pattern determined by recognizing alignment marks, but it is preferably formed based on the pattern determined by measuring the distance between alignment marks. Alternatively, the core pattern may be formed by determining its start point or end point by recognizing alignment marks.

The former method will be described below. Suppose that 11 core lines are to be provided at regular intervals in an area of 100 mm in width, a core pattern may be so designed that core lines are evenly spaced 10 mm apart. On an electrical and optical hybrid board where the core pattern is to be formed, an electrical interconnect pattern or the like is already provided. As described above, there is a possibility that the electrical interconnect pattern or the like has deviated from the original position as designed due to thermal history effect. To compensate this possible misalignment, the distance between alignment marks are actually measured and divided by 10 to obtain a core pattern pitch. By using this core pattern pitch for core formation, the relative positions of the electrical interconnect pattern and core pattern are made almost the same as those initially designed. The alignment marks are preferably provided at two or more corners of the electrical wiring board.

In the latter method, one or both of the start point and end point of a core pattern to be provided are determined, and a groove is formed using a dicing saw or the like to form a core pattern. For example, alignment mark(s) are recognized to determine the start point of a core pattern, the cutting depth and cutting distance are input to an automatic cutting program of a dicing saw, and then grooves are formed with the dicing saw according to the set program to form a desired core pattern. In this case, it is preferable to provide at least one alignment mark at a position corresponding to or near the core pattern is to be formed. Namely, for example, one alignment mark may be provided for one core pattern, or one alignment mark may be provided for two core patterns.

Figure 5:
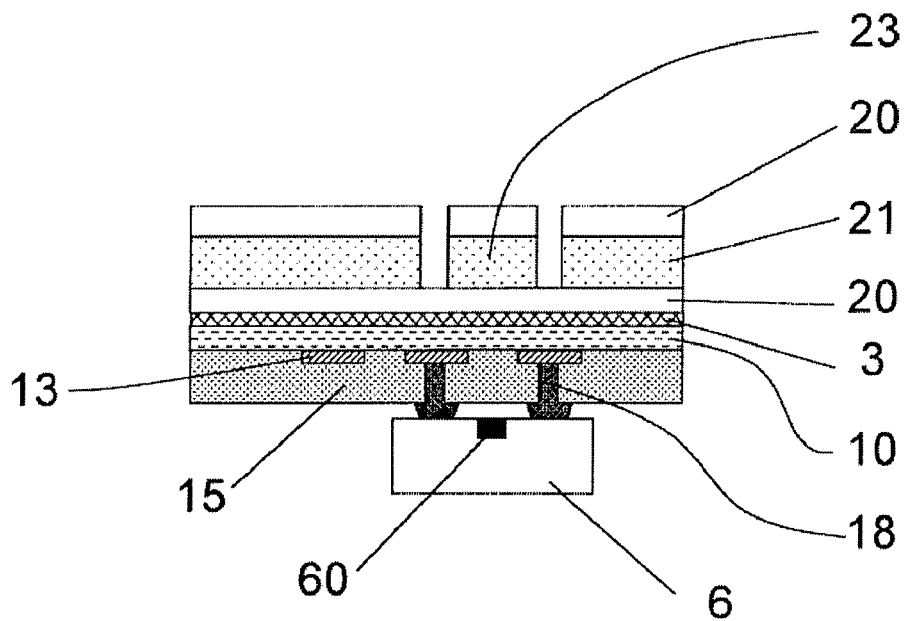
FIG. 5 shows an electrical and optical hybrid board on which an light-emitting device is mounted.

FIG. 1C shows an example of an electrical and optical hybrid board obtained as described above. In FIG. 1C reference numeral 5 denotes an electrical and optical hybrid board which includes grooves 22 formed by cutting, and core pattern 23 defined by the grooves. FIG. 5 shows an electrical and optical hybrid board on which a light emitting element is mounted. In FIG. 5 reference numeral 6 denotes a light emitting element which include optical center 60, and 18 denotes a solder ball filling a terminal formed of a non-coated area of solder resist. Light emitting element 6 is connected to the electrical and optical hybrid board via solder ball 18. Because electrical interconnect pattern 13, terminal (denoted by 18 in this drawing), and core pattern 23 are excellent in terms of relative position accuracy, optical center 60 of light emitting element 5 is aligned with core pattern 23 with high accuracy.

In FIG. 1C, the bottoms of grooves 22 are shown to exist at the same level as the surface of the lower clad layer, but it may be below the clad layer surface. Moreover, grooves 22 may remain intact as a cavity, or an additional clad layer may be laminated thereon.

2. Electrical and Optical Hybrid Board

An electrical and optical hybrid board of the present invention includes an electrical wiring board that includes on one surface an optical waveguide laminated thereon, and on the other surface an electrical interconnect pattern or electrical joint and a mark. The electrical joint connects the electrical and optical hybrid board to an external device. The mark is made of the same material as the electrical joint or electrical interconnect pattern.

"Mark" is a reference mark which provides a basis for processing the electrical and optical hybrid board and connecting it to other devices. The relative position accuracy between the mark and electrical interconnect pattern or the like is preferably high.

The mark is used as a basis of providing a core pattern of optical waveguide as described above, but it can also be used as a basis for providing a new core pattern on the electrical and optical hybrid board on which a core pattern has been provided.

In addition, the mark may also be used as a basis for connecting the electrical and optical hybrid board to other devices. Namely, the mark can be used as a basis for designing external devices to be connected to the electrical and optical hybrid board.

Examples of the material that is the same as those for the electrical interconnect pattern and electrical joint include metals such as copper and conductive paste. The electrical and optical hybrid board may be so configured that the electrical joint is formed as an opening in the surface protection layer for protecting the electrical interconnect pattern, and a mark is formed as an opening or surface protection layer. As described above, the surface protection layer can be formed of a solder resist, cover layer film, etc. It is preferable to use a solder resist for the surface protection layer in view of workability.

Although the electrical and optical hybrid board can be manufactured by the method described above, it can be manufactured by other methods.

EXAMPLES

The present invention will be described below with reference to Examples, which however shall not be construed as limiting the scope thereto.

[Preparation of Clad-Core Laminate]

"OPI-N1005" (manufactured by Hitachi Chemical Co., Ltd.) that is a polyamic acid solution of 2,2-bis(3,4-dicarboxyphenyl)hexafluoropropane dianhydride (6FDA) and 2,2-bis(trifluoromethyl)-4,4'-diaminobiphenyl (TFDB) was applied on a 8-inch silicon wafer by spin coating, and heated to form a polyimide film (thickness=20 µm) as a clad layer. Subsequently, "OPI-N3405" (manufactured by Hitachi Chemical Co., Ltd.) that is a copolymerized polyamic acid solution of 6FDA/TFDB and 6FDA/4,4'-oxydianiline (ODA) was applied on the clad layer by spin coating and heated to form a second polyimide film (thickness=80 µm) as a core layer. The above polyamic acid solution (OPI-N1005) was again applied on the core layer and heated to form a clad layer (thickness=7 µm). The films were immersed in a hydrofluoric acid solution to peel off from the silicon wafer. In this way a polyimide core/clad laminate was prepared in which the clad layer, core layer and clad layer are sequentially laminated.

[Lamination of Core/Clad Laminate onto Electrical Wiring Board]

A filler-free epoxy adhesive (EPDX™-AH, manufactured by Mitsui Chemicals Co., Ltd.) was applied on a release-treated PET film with an applicator to a dry thickness of 15 µm and pre-dried at 140° C. for 2 minutes. A center portion of the adhesive coat (40 mm×40 mm), including the PET film, was cut out with a cutter. The remaining adhesive film was laminated onto the core/clad laminate with a laminator. The PET film was then peeled off. The adhesive was attached to the lower clad layer which is thicker than the upper one.

A flexible electrical wiring board was prepared that includes as a base a 12.5 μm-thick polyimide film and a copper interconnect pattern formed thereon. Desired areas of the flexible electrical wiring board are protected by a solder resist. The flexible electrical wiring board includes alignment marks (100 μm-square) provided at each corner. The alignment marks are copper marks used for core pattern formation, and were formed at the same time as the copper interconnect pattern. The flexible electrical wiring board and adhesive-coated optical waveguide film were bonded together by heat press at 170° C. and under a pressure of about 4 MPa. The obtained laminate was allowed to stand to room temperature, and taken out from the pressing machine to obtain a film of 110 mm square. In this film the center portion (about 40 mm×40 mm) of the core/clad layer is not fixed to the flexible electrical wiring board with an adhesive.

[Formation of Core Pattern]

The film prepared above was placed to a dicing device with the core/clad laminate facing up.

The centers of two of the alignment marks which are provided on the opposite side of the flexible electrical wiring board to the core/clad laminate were recognized, measuring the distance between the centers. Based on the measured distance, the ratio of expansion or contraction of the film between the alignment mark centers was calculated. Furthermore, dicing pitch (core-to-core pitch) was calculated.

Since the material of the optical waveguide was transparent, the alignment marks were reliably recognized from the above by magnified observation using a lens, halogen lamp, etc.

Based on the obtained data, with a dicing saw (blade width=30 μm), linear grooves were formed so that the groove bottom exists in the lower clad layer. Two grooves define a core, and core patterns were formed at portions sandwiched by two grooves. Forty core pattern lines were formed for one film. The distance between the core pattern and electrical interconnect pattern was measured to confirm the relative position accuracy. As a result, it was confirmed that the relative position accuracy was much the same level as desired. That is, an electrical and optical hybrid board was obtained in which misalignment between the core pattern and electrical interconnect pattern is very small.

Multiple electrical and optical hybrid boards were manufactured similarly, and the distance between the core pattern and electrical interconnect pattern was measured for each sample to obtain relative position accuracy. As a result, 90% of the samples had desired levels of relative position accuracy. Thus, it was confirmed that electrical and optical hybrid boards having excellent relative position accuracy can be manufactured.

INDUSTRIAL APPLICABILITY

The present invention can provide an electrical and optical hybrid board in which the core pattern and electrical interconnect pattern or the like are placed in place with high accuracy. Therefore, the present invention is useful in the field of photo-electric converting devices such as electrical and optical hybrid boards.

The present application claims the priority of Japanese Patent Application No. 2006-350440 filed on Dec. 26, 2006, the entire contents of which are herein incorporated by reference.

EXPLANATION OF REFERENCE NUMERALS

1 . . . Electrical wiring board
10 . . . Insulating substrate
11 . . . Conductor layer
12 . . . Alignment mark
13 . . . Electrical interconnect pattern
14 . . . External lead-out electrode
15 . . . Surface protection layer formed of solder resist
16 . . . Terminal formed of non-coated area of solder resist
17 . . . Alignment mark formed of solder resist
18 . . . Solder ball
2 . . . Core/clad laminate
20 . . . Clad layer
21 . . . Core layer
22 . . . Groove
23 . . . Core pattern
3 . . . Adhesion layer
4 . . . Laminate
5 . . . Electrical and optical hybrid board
6 . . . Light-emitting element
60 . . . Optical center

The invention claimed is:

1. A method of manufacturing an electrical and optical hybrid board which includes an electrical wiring board having a transparent substrate made of resin and an optical waveguide including one clad layer, a core layer and an other clad layer laminated on the substrate of the electrical wiring board, the method comprising:
    (A) preparing a laminate of one clad layer, the core layer and the other clad layer on one surface of the substrate and preparing a conductive layer on an other surface of the substrate that is opposite to the one surface;
    (B) patterning an alignment mark and an electrical interconnect pattern or electrical joint from the conductive layer at the same time on the other surface of the substrate, so as to form the electrical wiring board, the alignment mark being used for forming a core pattern of optical waveguide, and the electrical joint being used for connection with an external device; and
    (C) forming a core pattern of optical waveguide on the basis of the alignment mark without using a photomask.

2. The method according to claim 1, wherein the electrical joint is an external lead-out electrode provided on an edge of the electrical wiring board, and step (B) is a step of patterning the external lead-out electrode and the alignment mark at the same time.

3. The method according to claim 1, wherein step (C) is a step of forming the core pattern by providing grooves defining a core on the basis of the alignment mark.

4. The method according to claim 1, wherein the alignment mark is provided at two or more corners of the other surface of the substrate, and step (C) is a step of forming the core pattern on the basis of a pattern determined by measuring the distance between the alignment marks.

5. The method according to claim 1, wherein at least one alignment mark is provided on the other surface of the substrate, at a position corresponding to or near the core pattern to be formed, and step (C) is a step of forming the core pattern on the basis of a pattern whose start point or end point has been determined based on the alignment mark.

6. An electrical and optical hybrid board comprising:
    an electrical wiring board having a transparent substrate made of resin; and
    an optical waveguide including one clad layer, a core layer, and an other clad layer on one surface of the substrate of the electrical wiring board, wherein the electrical wiring board includes, on an other surface of the substrate opposite to the one surface where the optical waveguide is arranged, an electrical interconnect pattern or electrical joint for electrical connection with an external device, and a mark, the electrical interconnect pattern or electrical joint for electrical connection and the mark being made of the same material.

7. The method according to claim 1, wherein the electrical joint comprises terminals for connection with light receiving/emitting elements that are mounted on the other surface of the substrate.

8. A method of manufacturing an electrical and optical hybrid board which includes an electrical wiring board including an electrical interconnect pattern, an optical waveguide including a core layer and a clad layer laminated on the electrical wiring board, and a surface protection layer provided on the electrical interconnect pattern of the electrical wiring board, the method comprising:
(A) preparing a laminate of the core layer and the clad layer on the electrical wiring board;
(B) forming an alignment mark and an electrical joint at the same time, when the surface protection layer is formed, on a surface of the electrical wiring board that is opposite to a surface where the laminate is formed,
the alignment mark formed of the surface protection layer and used for forming a core pattern of optical waveguide,
the electrical joint formed of an opening in the surface protection layer and used for connection with an external device, and
(C) forming a core pattern of optical waveguide on the basis of the alignment mark without using a photomask.

9. The method according to claim 8, wherein step (C) is a step of forming the core pattern by providing grooves defining a core on the basis of the alignment mark.

10. The method according to claim 8, wherein the alignment mark is provided at two or more corners of the surface of the electrical wiring board that is opposite to the surface where the laminate is formed, and step (C) is a step of forming the core pattern on the basis of a pattern determined by measuring the distance between the alignment marks.

11. The method according to claim 8, wherein at least one alignment mark is provided on the surface of the electrical wiring board that is opposite to the surface where the laminate is formed, at a position corresponding to or near the core pattern to be formed, and step (C) is a step of forming the core pattern on the basis of a pattern whose start point or end point has been determined based on the alignment mark.

12. An electrical and optical hybrid board comprising:
an electrical wiring board; and
an optical waveguide on the electrical wiring board,
wherein the electrical wiring board includes, on a surface opposite to a surface where the optical waveguide is formed, an electrical interconnect pattern, an electrical joint for electrical connection with an external device which is provided over the electrical interconnect pattern and is formed of an opening in a surface protection layer, and a mark formed of the surface protection layer.

* * * * *